United States Patent [19]

Rapoport

[11] Patent Number: 4,998,976
[45] Date of Patent: Mar. 12, 1991

[54] PERMANENT MAGNET ARRANGEMENT

[76] Inventor: Uri Rapoport, 425 S. Harvey, Oak Park, Ill. 60302

[21] Appl. No.: 106,114

[22] Filed: Oct. 7, 1987

[51] Int. Cl.⁵ .............................................. A61B 5/055
[52] U.S. Cl. ............................ 128/653 OSC; 335/302; 335/306; 324/318
[58] Field of Search ................ 128/653; 324/318, 319, 324/320; 335/296, 297, 302, 306

[56] References Cited

U.S. PATENT DOCUMENTS

| | | | |
|---|---|---|---|
| 3,423,670 | 1/1969 | Parker et al. | 324/320 |
| 3,611,223 | 10/1971 | Utsumi et al. | 335/296 |
| 4,042,898 | 8/1977 | Tomita et al. | 335/297 |
| 4,425,547 | 1/1984 | Sugimoto | 324/318 |
| 4,644,313 | 2/1987 | Miyajima | 324/318 |
| 4,646,046 | 2/1987 | Vavrek et al. | 324/320 |
| 4,672,346 | 6/1987 | Miyamoto et al. | 335/296 |
| 4,679,022 | 7/1987 | Miyamoto et al. | 324/319 |
| 4,682,111 | 7/1987 | Hughes | 324/320 |
| 4,695,802 | 9/1987 | Zijlstra | 324/319 |
| 4,703,276 | 10/1987 | Beer | 324/319 |
| 4,723,116 | 2/1988 | Müller et al. | 335/296 |
| 4,748,414 | 5/1988 | Knütlel et al. | 324/319 |
| 4,758,813 | 7/1988 | Holsinger et al. | 24/318 |
| 4,777,464 | 10/1988 | Takabatashi | 324/318 |
| 4,827,235 | 5/1989 | Inomata et al. | 335/297 |

FOREIGN PATENT DOCUMENTS

| | | | |
|---|---|---|---|
| 0067933 | 12/1982 | European Pat. Off. | 128/653 |
| 0591164 | 4/1959 | Italy | 335/296 |
| 0139304 | 6/1987 | Japan | 335/296 |
| 0177903 | 8/1987 | Japan | 335/296 |
| 2400611 | 2/1984 | PCT Int'l Appl. | 128/653 |
| 519661 | 8/1976 | U.S.S.R. | 324/19 |

Primary Examiner—Lee S. Cohen
Assistant Examiner—John D. Zele
Attorney, Agent, or Firm—Jones, Day, Reavis & Pogue

[57] ABSTRACT

A permanent magnet assembly used for creating a uniform magnetic field across a portion of an air gap has a permanent magnet grouping, including a first, principal magnet, a pole piece contacting said principal magnet, and a set of auxiliary magnets extending about the periphery of the pole piece. Two such magnet groupings are positioned within a test chamber, separated by spacers, with the magnet groupings and the chamber defining an air gap across which the magnetic field extends. Apertures formed in selected panels of the test chamber enable an object to be tested to be inserted into the chamber and held within a selected portion of the magnetic field formed therewithin. The strength and uniformity of the magnetic field is adjusted by including a second set of auxiliary permanent magnets or a set of electromagnetic coils positioned within the chamber proximate the respective pole pieces. Further adjustment of the magnetic field is accomplished by shaping the front surfaces of the pole pieces, thus affecting the shape and direciton of the resulting magnetic field.

24 Claims, 4 Drawing Sheets

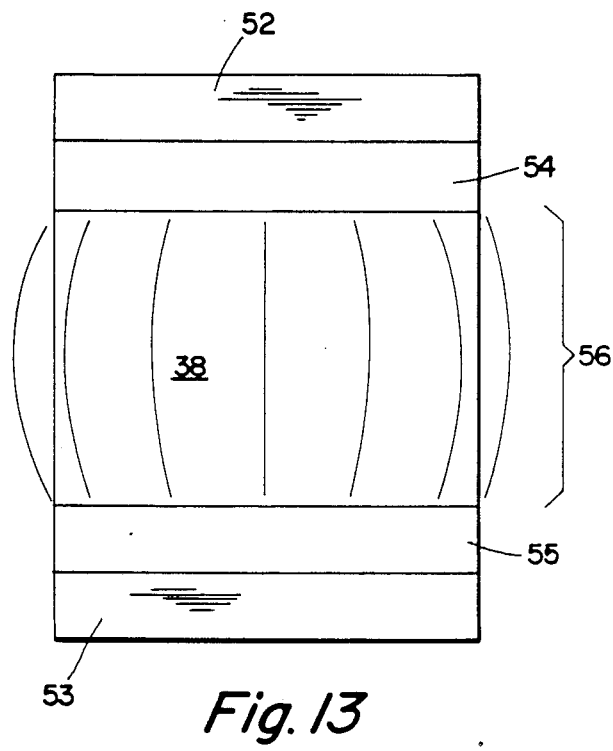
Fig. 13
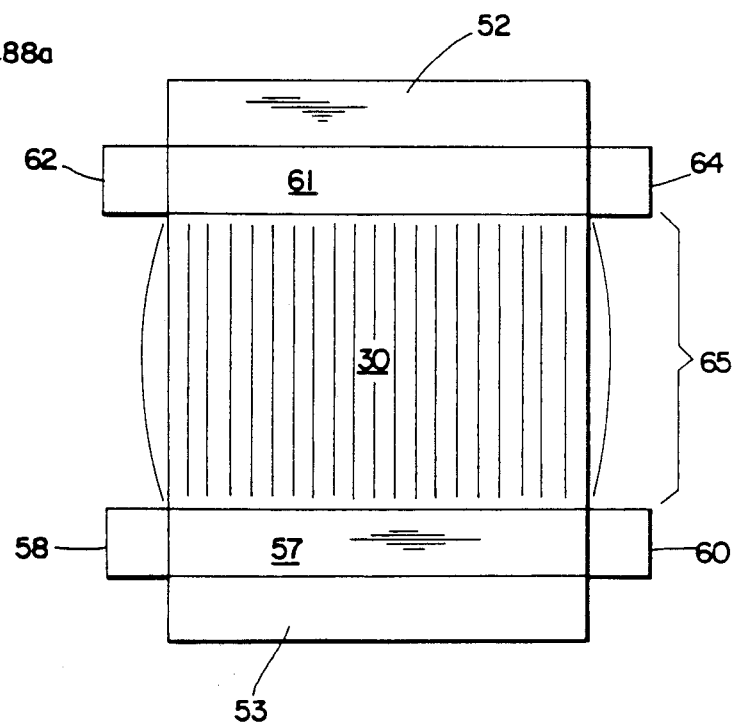
Fig. 12
Fig. 14

PERMANENT MAGNET ARRANGEMENT

BACKGROUND OF THE INVENTION

This invention relates generally to permanent magnets and, more particularly, to configurations of permanent magnets used to produce a magnetic field at a specified situs having a required strength and flux alignment. This application is related to U.S. Pat. No. 4,875,486 entitled "Instrument For Non-Invasive Testing For Glucose And Other Body Fluid Constituents".

The use of permanent magnets to produce and maintain magnetic fields of predetermined characteristics has found wide-spread application throughout varied areas of technology. As one example, the use of permanent magnets in loud speakers makes possible the accurate reproduction of sounds and music.

Permanent magnets offer numerous advantages over electromagnets, the most prominent of which is the production and maintenance of a magnetic field without requiring the application of electrical energy, thus producing a device which is independent of the need for an external power source. This is an important consideration in designing portable apparatuses, and also results in constructions requiring little or no maintenance beyond initial assembly.

The present invention utilizes particular arrangements and configurations of permanent magnets to create strong, uniform magnetic fields. Although the uses to which the present invention may be put are described herein as principally in connection with medical diagnostic equipment, it should be understood that the invention may be utilized wherever a magnetic field is required.

As described in the above-mentioned co-pending patent application, the use of a magnetic field makes possible the non-invasive testing of human body systems to detect the presence of certain substances. In particular, permanent magnets are used to create a first, or biasing magnetic field within which initially randomly oriented $^1H$ protons present in the nuclei of the substance being tested are aligned. Thereafter, a second energy field is applied to increase the energy level of said nuclei. When the second energy field is allowed to collapse, the nuclei return to their original, aligned state, releasing energy which is detected and analyzed in the form of an image or a spectrum. Certain spectra have been found to be characteristic of particular substances, and the technique of nuclear magnetic resonance (NMR) may be used to establish the presence and identity of such substances and the concentrations within which such substances are present.

Heretofore, the use of NMR has called for the construction of large, expensive machinery to produce and maintain the magnetic fields necessary for such testing. In utilizing NMR diagnostic techniques, creating and maintaining the primary or first magnetic field is of critical importance. It has been found that in designing such equipment to be compact and portable, it is necessary to create a primary magnetic field which is uniform in strength, and which has a relatively dense magnetic flux. Visually, such a field may be defined by the lines of flux which indicate not only the strength of the magnetic field, but its orientation as well.

Ideally, the lines of flux should be parallel or nearly parallel and uniformly spaced throughout the test zone, i.e., that portion of the magnetic field used for diagnostic purposes. It has been found it efficacious to produce the first or primary magnetic field with permanent magnets rather than electromagnets.

The use of magnets and magnetic energy to diagnose and treat biological disfunctions is well known. As an example, in French Patent No. 2,562,785 (Jeandey, et al.) a permanent magnet system for NMR imaging medical diagnostics uses pole pieces separated by stacked permanent magnets to form an open examination area with the pole pieces "bridging" both stacks of magnets. Jeandey, et al. also teach the use of electromagnetic coils to adjust the resulting magnetic field.

Japanese Patent No. 56-14145 (Nippon Denshi K.K.) teaches an arrangement of permanent magnets held within a cylinder. A spacer is placed within the cylinder and sandwiched about the spacer are a pair of cylindrical pole pieces. The entire assembly is held together by placing magnets outside the pole pieces (separated from the pole pieces by a buffer) and utilizing the attraction of the magnets for each other to hold the entire assembly in place. Nippon Denshi also apparently teaches the use of pole pieces having raised central portions, that is, flat faces which extend into the air gap between the pole pieces and from which the operative flux apparently emanates. Nippon Denshi fails to teach any use of auxiliary magnets in combination with the principal magnets.

U.S. Pat. No. 4,635,643 (Brown) teaches the use of NMR equipment to perform in vivo measurement of the mineral content of bone. Brown, however, teaches no arrangement of permanent magnets in constructing a test chamber for NMR use.

In U.S. Pat. No. 4,134,395 (Davis) the patentee teaches the use of a permanent magnet to detect diseased body parts by observing the effect the application of that magnetic field has on the muscles of the legs. Davis also describes the physical characteristics of a bar magnet showing the extent and shape of the magnetic field produced by such a magnet.

U.S. Pat. No. 3,467,076 (Frisch, et al.) discloses a magnet arrangement used to produce a field of high magnetic flux within which the effect of magnetic energy on living things may be observed. Frisch, et al., use a centrally-located electromagnet sandwiched between ferromagnetic pole pieces which extend beyond the edges of electromagnet to form an air gap within which the magnetic flux is produced.

In U.S. Pat. No. 3,358,676 (Frei, et al.), a method of treatment is taught which requires the use of an extremely large and cumbersome magnet structure.

The size and complexity of magnets required to utilize the phenomenon of NMR in making diagnoses is exemplified in an article appearing in the December, 1977 issue of *Popular Science* magazine, entitled "Damadian's Supermagnet". The author discusses the use of NMR to detect cancer cells: the size and strength of the magnetic field required to perform this diagnostic technique, and the size and complexity of the magnet used to produce such a field are well described.

BRIEF DESCRIPTION OF THE INVENTION

A grouping of permanent magnets creates a magnetic field of heightened strength and uniformity. In one embodiment, two such magnet groupings define a test zone within which a sample to be tested is placed. In using NMR medical diagnostic techniques for in vivo testing, the test sample may be a body part, such as a finger. Permanent magnets are used in the arrangement to create a field of sufficient strength and uniformity to allow the application of principles of NMR to detect the presence of certain substances within the test sample.

A test chamber, rectangular in cross-section, includes first and second groupings of magnets spaced apart one from the other, defining an air gap within which the test sample is positioned. Each magnet grouping includes a first or principal magnet, a ferromagnetic pole piece in face-to-face contact with said principal magnet, and one or more auxiliary magnets arranged about the outer periphery of the pole piece. The second grouping of magnets includes components identical to those in the first grouping and is placed within the test chamber opposite the first grouping. The polarity of the second grouping is opposite that of the first grouping, resulting in lines of magnetic flux extending between such groupings. Non-ferromagnetic spacers are used to prevent the first magnet grouping from being drawn into contact with the second magnet grouping, thereby creating the air gap across which the magnetic flux is directed and within which the test zone is created for the sample to be tested.

In another preferred embodiment of the invention, secondary auxiliary permanent magnets, or electromagnetic coils are placed within the test chamber to "fine-tune" the flux alignment across the air gap.

In yet another preferred embodiment of the invention, the pole pieces are specially configured to make the resulting magnetic field stronger and more uniform.

In a further preferred embodiment, no pole pieces are used, and the auxiliary magnets contact the principal magnet. The principal magnet may also be specially configured to adjust or modify the resulting magnetic field.

BRIEF DESCRIPTION OF THE DRAWINGS

These and further aspects of the present invention may best be understood by reference to the accompanying drawings, wherein:

FIG. 12 is a side sectional view of a second version of the magnet arrangement shown in FIGS. 10 and 11;

FIG. 13 is a schematic representation of lines of magnetic flux produced without the use of auxiliary magnets;

FIG. 14 shows the arrangement of FIG. 13 with the auxiliary magnets in place.

DETAILED DESCRIPTION OF THE DRAWINGS

Figure 1:
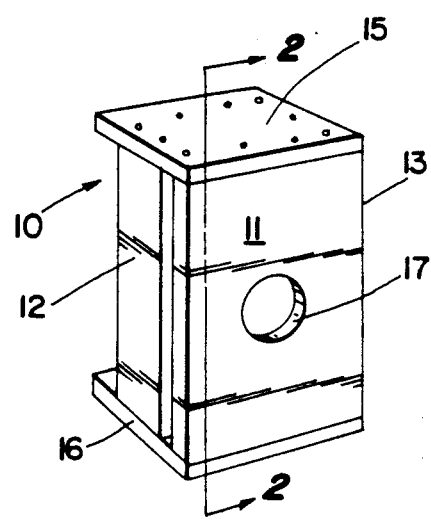
FIG. 1 is a perspective view of a test chamber constructed in accordance with the teachings of the present invention.

Referring now to FIG. 1, the numeral 10 indicates generally a preferred embodiment utilizing the present invention, namely, a test chamber into which a test sample to be analyzed using NMR techniques is placed and within which a first, or biasing magnetic field is present. For purposes of clarity, the components required to produce the second magnetic field, used in NMR analysis, have been omitted.

Chamber 10 has a front panel 11, side panels 12 and 13, a rear panel 14, and top and bottom panels 15 and 16 respectively. In the preferred embodiment shown herein, chamber 10 is depicted as hollow and rectangular. Test apertures 17 and 18 are formed, respectively, centered on front and rear panels 11 and 14.

Figure 3:
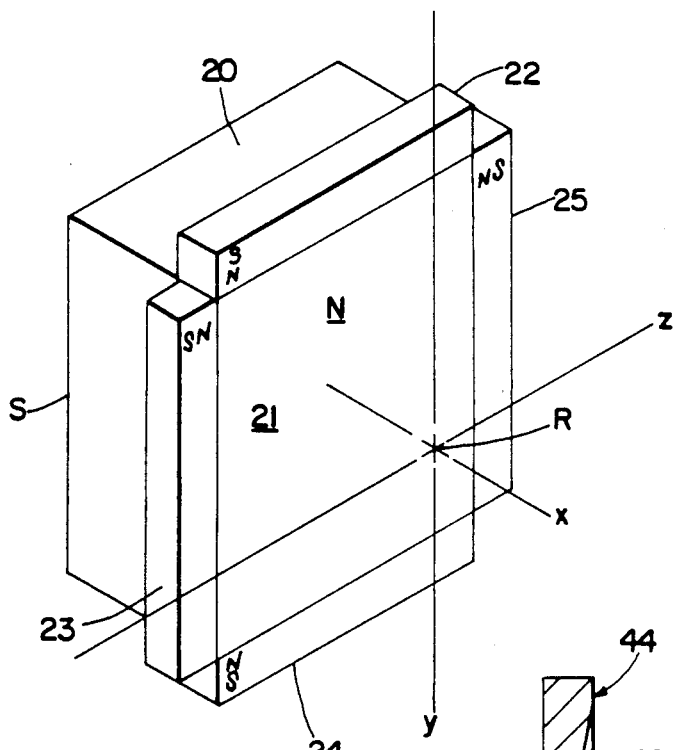
FIG. 3 is a partial perspective view illustrating the arrangement of one grouping of permanent magnets.

Within chamber 10, there is disposed a pair of magnet groupings to be described in greater detail hereinafter. As best seen in FIG. 3, one such magnet grouping preferably includes a principal permanent magnet 20 arranged in face-to-face contact with a ferromagnetic pole piece 21. The preferred embodiment of FIG. 3 further includes auxiliary magnets 22, 23, 24 and 25 arranged in edgewise fashion about the periphery of pole piece 21. In this preferred grouping, both principal magnet 20 and pole piece 21 are square, and auxiliary magnets 22, 23, 24 and 25 are bar magnets.

Figure 2:
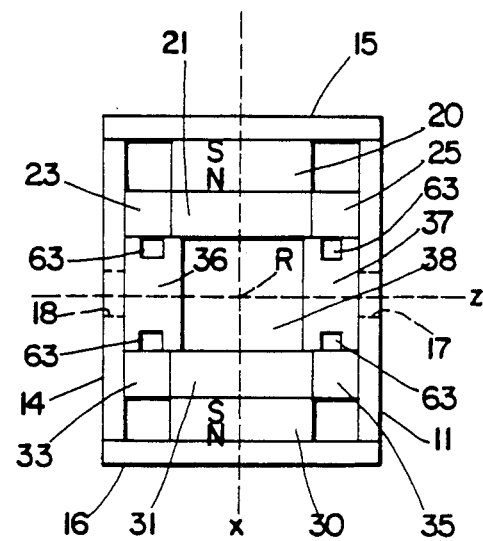
FIG. 2 is a side elevational view looking generally in the direction of arrows 2—2 of FIG. 1, and with a side panel 12 removed for viewing the magnet arrangement in the interior of the housing without having to take any section requiring cross-hatching.

The second grouping of permanent magnets, shown in FIG. 2, is identical to the grouping shown in FIG. 3, with a principal magnet 30 a pole piece 31, side auxiliary magnets 33 and 35, top auxiliary magnet 32 and bottom auxiliary magnet 34 (magnets 32 and 34 are not herein specifically shown but are positioned to correspond to bottom auxiliary magnets 22 and 24 respectively). Magnet groupings are disposed within chamber 10 as shown in FIG. 2 with pole pieces 21 and 31 arranged in a spaced-apart face-to-face relationship As shown in FIG. 2, non-ferromagnetic spacers 36 and 37 are used to separate the first and second magnet groupings thereby physically preventing the groupings from drawing together, creating an air gap or cavity 38 across which lines of magnetic flux extend from pole piece 21 to pole piece 31. A material used successfully for the spacers is brass; other rigid non-ferromagnetic substances may also be used.

The individual panels of test chamber 10 are formed of a ferromagnetic material such as carbon steel to provide a complete path or circuit for the magnetic energy generated by the first and second magnet groupings throughout the entire chamber.

As seen in FIG. 3, the preferred arrangement of permanent magnets in each grouping results in a pole piece having a north polar face, and peripheral auxiliary magnets having a north polar face in direct contact with pole piece 21 and a south polar face facing away from pole piece 21. It is understood that the polarity referred to here is for purposes of convenience only in that the same pole on each auxiliary magnet is intended to be facing inwardly, corresponding to the pole effectively present on the air gap face of the pole piece.

The second magnet grouping has a polarity configuration opposite that of the first magnet grouping, i.e., the face of pole piece 21 has an opposite polarity than the face of the pole piece 31.

Referring now to FIGS. 4, 5, 6, 7 and 8, various preferred embodiments of pole pieces such as 21 are therein depicted. As seen in FIG. 3, a first preferred embodiment of pole piece 21 is that of a solid rectangular parallelepiped having planar front and rear faces. For reasons that will be set forth more fully hereinbelow, other pole piece configurations have been found to offer certain advantages.

Figure 4:
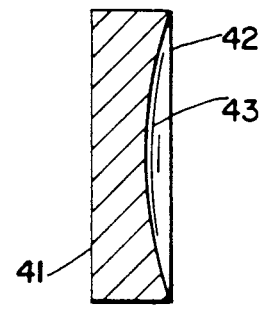
FIG. 4 is a lateral sectional view of one embodiment of a pole piece.

Referring now to FIG. 4, there is shown in sectional view, a second preferred pole piece 40 having a flat planar rear face 41 and a front face 42 having a spherical hollow 43 formed therein.

Figures 5, 6:
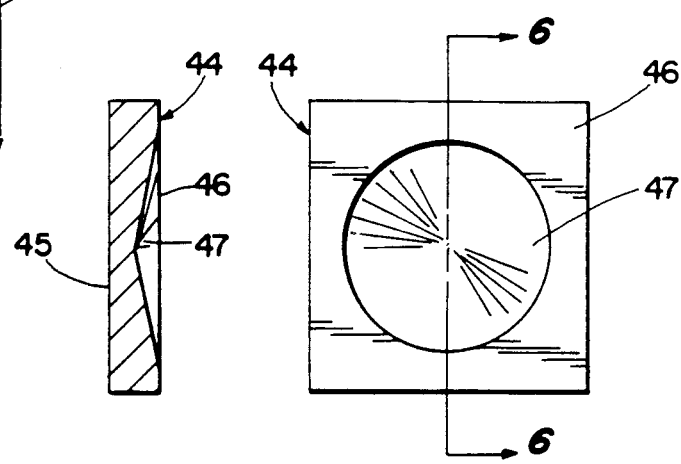
FIG. 5 is a front elevation of a second embodiment of a pole piece.
FIG. 6 is a lateral sectional view of the pole piece shown in FIG. 5.

FIGS. 5 and 6 show, respectively, front and side sectional views of a third preferred pole piece 44 having a planar rear face 45 and a front face 46 within which a conical hollow 47 is formed.

Figure 7:
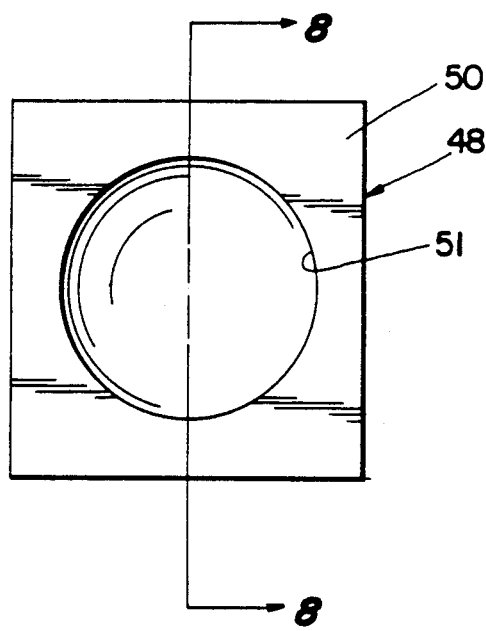
FIG. 7 is a front elevational view of a third embodiment of a pole piece.
Figure 8:
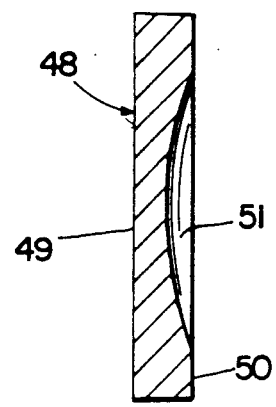
FIG. 8 is a lateral sectional view of the pole piece shown in FIG. 7.

FIGS. 7 and 8 show, respectively, a front elevational view and a side sectional view of a fourth preferred pole piece 48 having a planar rear wall 49 a front wall 50 and a shallow curved hollow 51 formed therein. As described hereinafter, hollow 51 may take the shape of a paraboloidal or exponentially-defined curve, or may be a complex curved surface constructed to maximize strength and uniformity of the magnetic field at selected locations within the air gap.

The various shapes and configurations of the pole pieces discussed above are intended to enhance the cooperation of auxiliary magnets 22, 23, 24 and 25 with principal magnet 20 to provide a strong uniform magnetic field within cavity 38. Although the reasons that such a magnetic field is produced are not fully understood, it is believed that use of auxiliary magnets surrounding the selected pole piece results in a stronger magnetic field at the edges of the pole piece than at its center. The effect of this increased field strength is to straighten the flux lines extending across cavity 38 and to force the flux lines closer to the center of cavity 38. As seen in FIG. 13, a typical pattern of flux lines extending between magnet assemblies demonstrates the tendency of the lines of flux to assume a new linear configuration, i.e., to "bow" outward as the edges of the magnet are approached. Included in FIG. 13 are principal magnets 52 and 53 and corresponding pole pieces 54 and 55. Flux lines 56, although not drawn precisely to scale, illustrate the above-described tendency.

It has been determined that the strength of the magnetic field produced across air gap 38 varies across the vertical distance between the midpoint of the air gap and each pole piece, and the distance from the midpoint of the air gap horizontally toward the outer periphery of the pole pieces.

The reference point R for such measurements, shown in FIG. 3, is the point midway between (a) pole pieces 21 and 31; (b) front panel 11 and rear panel 14; and (c) side panels 12 and 13. As seen in FIGS. 3 and 4, the axes of reference are drawn with the x-axis extending perpendicular to pole pieces 21 and 31, the y-axis extending parallel to pole pieces 21 and 31, and perpendicular to side panels 12 and 13, and the z-axis extending parallel to pole pieces 21 and 31, and perpendicular to front panel 11 and rear panel 14.

When magnetic field strength is measured in the y-z plane. It has been found that the strength of the magnetic field tends to decrease from a maximum at reference point R in a generally curvilinear fashion. With respect to magnetic strength measured in the plane x-y plane. It has been found that magnetic strength tends to increase when measured from reference point R along the x-axis following a generally curvilinear track.

Ideally, the change in magnetic strength measured from the reference point should be minimized throughout the field maintained within the test zone, that is, the zone within which the sample to be tested will be placed. An ideal magnetic field will exhibit uniform field strength and field direction, that is, the field strength and direction will be the same in all parts of the field. Use of pole pieces with varying configurations, and other "fine-tuning" techniques to come closer to such ideal field characteristics will be discussed in more detail herein below.

It should be understood that when the term "flux lines" is used, the term represents the direction and strength of the flux field. The pattern of the flux field may be described, for example, by the tendency of small ferromagnetic particles such as iron filings to arrange themselves along the paths of magnetic force, i.e.. the flux lines. The strength of the magnetic field may generally be described as the density of the flux lines that is, where the flux lines are closer together the field is stronger.

FIG. 14 provides a schematic representation of the variation shown in the lines of magnetic flux with the addition of four auxiliary magnets surrounding pole piece 55 of FIG. 13, only three of such auxiliary magnets being shown at 57, 58 and 60 in FIG. 14. Four auxiliary magnets also surrounding pole piece 54 of FIG. 13, and only three of such auxiliary magnets are shown at 61, 62 and 64 in FIG. 14. The resulting lines of magnetic flux indicated schematically at 65 are straighter, more closely packed, and present a more uniform magnetic field throughout the centermost portion of air gap 38.

It should be noted that spacers 36 and 37 have been omitted from FIGS. 13 and 14 for purposes of clarity.

It should also be understood that the flux lines shown in FIG. 13 and 14 extend throughout cavity 38 in three-dimensions.

As best seen in FIGS. 1 and 2, apertures 17 and 18 are provided to enable the insertion therethrough of a test sample. As an example, for use with NMR diagnostic devices, the "test sample" would be a body member, preferably a finger, positioned in the magnetic field created by the magnet arrangements described herein above.

Although only one aperture such as 17 or 18 is actually required, a pair of opposed apertures are provided in order to assure that the magnetic field created by the magnet arrangements disposed within chamber 10 is as uniformly distributed as possible by making chamber 10 as symmetric as possible.

Aperture 17 is through front panel 11 of test chamber 10 to enable the test sample to be inserted into that portion of the magnetic field to be used for testing an analysis. In order to assure accurate and reproducible test results, the magnetic field created within test chamber 10 should be as uniformly distributed as possible across the space to which aperture 17 communicates. In this context, "uniform" means that the lines of flux extending across the air gap between the opposed magnet arrangements will be uniformly spaced and will be linear to as great a degree as possible with respect to that space within test chamber 10 to be occupied by the inserted test subject. It should be noted that, with reference to FIG. 1, the lines of magnetic flux extend in a vertical direction parallel to front panel 11, and the test sample is inserted into the magnetic field generally perpendicular to the lines of flux.

Figure 9:
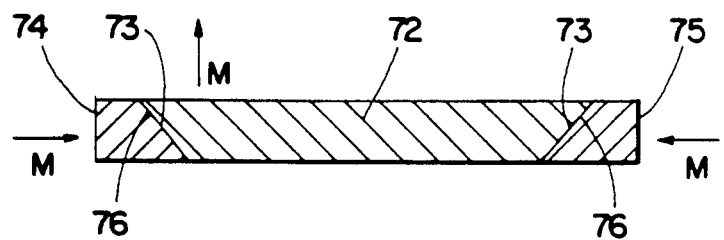
FIG. 9 is a cross-sectional view showing a second arrangement of auxiliary magnets surrounding a pole piece.

Referring now to FIG. 9, there is shown a cross-sectional view of an alternate preferred embodiment of an auxiliary magnet/pole piece arrangement. Pole piece 72 is formed as a square having beveled edges exemplified at 73. The direction of the magnetic field is shown in FIG. 9 using arrows and the letter designation M. Auxiliary magnets 74 and 75 are formed with beveled surfaces, 76 to mate closely with edges 73 of pole piece 72. It is expected that this arrangement will result in a "straightening" effect on the lines of magnetic flux as they near the outer edges of pole piece 72. While the reason for this effect is not yet fully understood, it is believed that the lines of magnetic flux leave auxiliary magnets 74 and 75 normal to the interface between said auxiliary magnets and pole piece 72. The lines of magnetic flux emanating from pole piece 72 also exhibit a tendency to leave normal to the surface of pole piece 72. It is believed that the beveling of the mating edges of the respective auxiliary magnets and pole piece present a less abrupt and more gradual realignment of the lines of magnetic flux travelling from, for example, auxiliary magnet 74 to pole piece 72 and thence outwardly across the air gap within chamber 10. In other words, where pole piece 72 is non-beveled, the magnetic flux in question must go through a complete 90 degree turn to, exit from the face of pole piece 72. In the example shown in FIG. 9, the lines of flux entering pole piece 72 from auxiliary magnet 74 need be turned only through a 45 degree angle in order to exit at right angles from pole piece 72. It is believed that this gradual, step-wise alignment of magnetic flux results in a less distorted, enhanced and straighter array of flux lines. The angles of inclination for are 73 and 76 are preferably complementary, i.e., totaling 90 degrees to allow the front faces of pole piece 72 and auxiliary magnets 74 and 75 to be coplanar.

Other selected embodiments of pole pieces are shown in FIG. 4, 5, 6, 7 and 8. In these embodiments, the tendency of the outermost lines of flux to "bow" outwardly is counteracted by changing the surface configuration of the pole piece in question. In FIG. 4, pole piece 40 is formed with a front face 42 "dished" to form a spherical hollow 43. It is theorized that the lines of flux leaving pole piece 40 will do so normal to the curve of hollow 43. Thus, the outermost lines of flux will be angled inwardly in an attempt to counter the tendency of said lines of flux to bow outwardly at the edges of pole piece 40. Within this context, "normal" would be described as an outwardly extending line perpendicular to a tangent drawn to the surface of hollow 43 at any given point.

FIGS. 5 and 6 illustrate a second variation of the embodiment shown in FIG. 4. In FIGS. 5 and 6, a cone-shaped hollow 47 is formed in the front face 46 of pole piece 44. Again, it is anticipated that the lines of flux exiting the front face 46 of pole piece 44 will exit perpendicular to the surface of the cone-shaped hollow 47.

Referring now to FIGS. 7 and 8, yet another variation of the embodiment shown in FIG. 4 is presented. Pole piece 48 has a front surface 50 within which a curved hollow 51 is formed.

The configuration of the hollow to be formed in the selected pole piece may be a regular geometric shape, or may be dictated by a computer-performed analysis of the characteristics of each such magnet arrangement and the factors that will affect the direction and strength of the resulting magnetic field. While the results of this analysis have not yet been fully characterized, it has been learned that the uniformity of the magnetic field produced within the test zone is enhanced when the outermost portions of a selected pole piece are closer than the central portion of the pole piece to a plane parallel to pole pieces 21 and 31 and bisecting air gap 38. The precise shape of a pole piece to maximize the strength and uniformity of the magnetic field throughout the test zone may consist of a regular geometric shape or may consist of a complex curve or set of curves.

Figure 15:
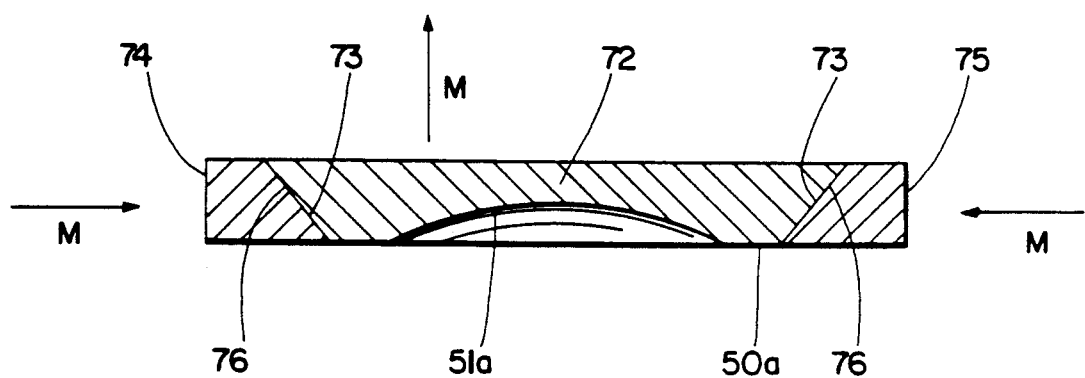
FIG. 15 is a cross-sectional elevational view showing the pole piece and auxiliary magnet arrangement of FIG. 9, modified by providing the pole piece with the recess of FIGS. 7 and 8.

It is anticipated that the techniques or embodiments shown in FIG. 4 through 9 may be combined, with pole pieces and auxiliary magnets having beveled edges and with pole pieces having surface hollows, holes, depressions, projections or other configurations formed therein or thereon. For example, FIG. 15 shows the pole piece and auxiliary magnet arrangement of FIG. 9 with an added depression 51a and circumferential flat 50a like the depression and flat 51, 50 of FIG. 8.

Figure 10:
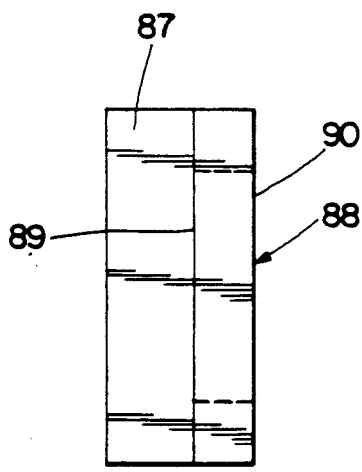
FIG. 10 is a side elevational view of a magnet arrangement utilizing a circular pole piece and curved, auxiliary magnet segments.
Figure 11:
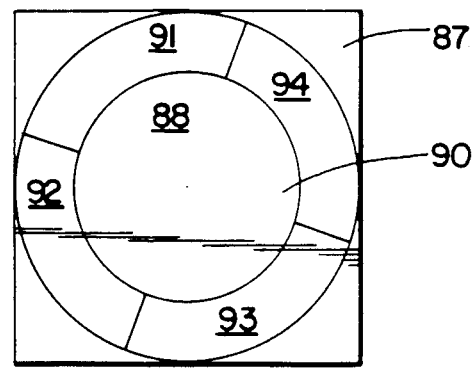
FIG. 11 is a front elevational view of the arrangement shown in FIG. 10.

Other embodiments of pole piece/auxiliary magnet arrangements are demonstrated in FIGS. 10 and 11 and 12. In FIG. 11, principal magnet 87 is formed as a square while pole piece 88 is formed as a solid cylinder, with one of the, opposed circular bases 89 placed against principal magnet 87 and with the remaining opposed face 90 facing outwardly. Auxiliary magnets 91, 92, 93 and 94 are shown in FIG. 11 as toroidal segments forming a ring having a square or rectangular cross section and fitting completely about the outer periphery of pole piece 88. Such an arrangement avoids the gaps shown in FIG. 3 where auxiliary magnets 22, 23, 24 and 25 terminate. Again, it is theorized that the arrangement shown in FIGS. 10 and 11 may produce a more uniform magnetic field by reason of the total peripheral contact of auxiliary magnets 91, 92, 93 and 94 with pole piece 88.

As shown in FIG. 12, it is also anticipated that the periphery of pole piece 88a that cooperates with principal magnet 57a and the periphery of auxiliary magnet segments, only two of which are shown at 91a and 93a in FIG. 12, may be beveled to achieve the "straightening" effect discussed hereinabove in connection with FIG. 9. It is also to be understood that although four auxiliary magnet segments are illustrated in FIGS. 10 and 11, any number of such segments may be used as required.

It is anticipated that the pole pieces and magnets to be used in connection with the present invention may be precisely machined to produce precisely shaped and configured pieces. One material believed to be satisfactory for the manufacture of the principal magnets is known as neodimium 35, although the operation of the present invention is not deemed to be dependent upon the selected magnetic material.

It is anticipated that the accuracy and efficiency of the proposed invention may be heightened by providing a method of "fine-tuning" the magnetic field produced by the permanent magnet arrangements. In one such method, the fine-tuning may be accomplished by the use of secondary auxiliary permanent magnets disposed within test chamber 10 proximate to the selected auxiliary magnets surrounding each selected pole piece. The placement of such secondary auxiliary magnets is shown schematically in FIG. 2 at 63. The positioning and strength of such secondary auxiliary magnets may be adjusted experimentally in order to produce an optimally uniform magnetic field, particularly across that portion of the field interrupted by the insertion of the test subject through aperture 17.

Yet another variation of the fine tuning adjustment uses one or more electromagnetic coils, with each such coil producing an adjustable magnetic field. It is anticipated that each such coil would occupy a position analogous to those shown at 63 in FIG. 2 with respect to the secondary auxiliary magnets. It is also anticipated that adjusting the current flow to each such coil may be done manually, or through the operation of a self-diagnostic computer-adjusted control unit which would measure the strength and alignment of the magnetic field within test chamber 10 and perform pre-programmed electrical calibrations in order to set the current passing through said electromagnetic coils.

Assembly of the test chamber shown in FIG. 1 may be described as follows. Principal magnet 30 is positioned on bottom panel 16, and pole piece 31 is positioned atop principal magnet 30. Next, spacers 36 and 37 are stacked and held atop pole piece 31. Pole piece 21 is then stacked atop spacers 36 and 37, followed by principal magnet 20 and top panel 15. Auxiliary magnets 33 and 35 are next positioned along the edges of pole piece 31. In like fashion auxiliary magnets 23 and 25 are positioned along the corresponding edges of pole piece 21. Thereafter, front and rear panels 11 and 14 are placed in position. Next, auxiliary magnets 32 and 34 are placed about the periphery of pole piece 31 and corresponding auxiliary magnets 22 and 24 are placed about the periphery of pole piece 21. Thereafter, side panels 12 and 13 are placed in position to complete the assembly of test chamber 10. It is anticipated that clamps or jigs may be required to overcome the natural tendency of the respective auxiliary magnets to repel one another when the north polar faces on adjacent magnets are drawn in proximity to one another.

In another preferred embodiment of the present invention, it is anticipated that principal magnet 20 may be used without a corresponding pole piece in a magnet grouping consisting of principal magnet 20 and auxiliary magnets 22, 23, 24, and 25. In this alternate embodiment, said auxiliary magnets would be placed about the periphery of principal magnet 20. It is also anticipated that machining or shaping the face of principal magnet 20 as described hereinabove with respect to pole piece 21 will produce the same field-adjusting-enhancing effects as described hereinabove. To construct a test chamber such as that shown in FIG. 1, a pair of such alternate groupings, consisting of a principal magnet surrounded by auxiliary magnets may be used in the same fashion as described hereinabove.

In the arrangements of FIGS. 9 and 12, it will be recognized that pole pieces 52, 58 could themselves be permanent magnets. Thus, the outer peripheral bevel would be on the magnet itself, and the auxiliary side magnets would engage the outer peripheral bevel on the permanent magnet itself. Likewise, the hollows 43, 47 in the pole pieces of FIGS. 4 and 6 could also be formed directly in the end face of the permanent magnet itself.

The auxiliary permanent magnet means defines at least part of a means for providing a continuous solid flux path between the outer periphery of each pole piece and the housing that is uninterrupted by any air gap. The auxiliary permanent magnet means itself may completely span the space between the outer periphery of each pole piece and the inner peripheral surface of the housing as shown for auxiliary permanent magnets 23, 25 and 33, 35 in FIG. 2. The continuous solid flux path effectively has the auxiliary permanent magnet means contacting both the outer periphery of a pole piece and the inner peripheral surface of the housing. With each of the principal permanent magnets and the auxiliary permanent magnet means contacting both the pole pieces and the housing, a very efficient path of magnetic energy flow is provided for the magnetic field.

As shown in FIGS. 7 and 8, depression 51 extends across substantially more than one-half the pole piece face, and substantially the entire surface area of the depression is curved so as to be non-perpendicular to the longitudinal axis of the magnet assembly represented by the X axis in FIG. 2. Also, a circumferential flat area surrounds the depression to provide a bearing area for supporting the pole pieces on the spacers 36, 37 in FIG. 2.

As shown in FIG. 2, each principal permanent magnet and pole piece have substantially the same size and shape in their contact area, and the auxiliary permanent magnets extend a substantial distance outwardly of the periphery of such contact area for substantially enhancing the strength and uniformly of the field in the test zone.

While the foregoing has described the present invention with respect to certain preferred embodiments thereof, it is anticipated that others will perceive variations which, while differing from the foregoing, do not depart from the spirit and scope of the invention as herein described and claimed, and no limitations as to the scope of the present invention are herewith intended.

What is claimed:

1. A permanent magnet assembly for providing a magnetic field across an air gap comprising:
   a ferromagnetic housing;
   first and second permanent magnet groupings in said housing, each such grouping including:
   (a) a principal permanent magnet having a magnetization direction,
   (b) a ferromagnetic pole piece having opposite front and rear faces and an outer periphery, said principal permanent magnet contacting said rear face of said pole piece,
   (c) auxiliary permanent magnet means having a magnetization direction and being positioned at, contacting and extending about said outer periphery of said pole piece;
   said principal permanent magnet and said auxiliary permanent magnet means in said first magnet grouping being positioned with said magnetization directions thereof extending substantially perpendicular to one another and having north magnetic poles on the surfaces thereof engaging said pole piece in said first magnet grouping for providing a north magnetic pole on said front face of said pole piece in said first magnet grouping;
   said principal permanent magnet and said auxiliary permanent magnet means in said second magnet grouping being positioned with said magnetization directions thereof extending substantially perpendicular to one another and having south magnetic poles on the surfaces thereof engaging said pole piece in said second magnet grouping for providing a south magnetic pole on said front face of said pole piece in said second magnet grouping;

said first and second magnet groupings being positioned in said housing with said north and south magnetic poles on said front faces of said pole pieces facing one another in spaced-apart relationship to provide an air gap across which a magnetic field extends to define a test zone;

said auxiliary permanent magnet means acting to enhance the strength and uniformity of said magnetic field in said test zone;

said housing having means for allowing insertion of an object to be tested into said test zone;

each said pole piece in each of said first and second magnet groupings having a longitudinal axis;

each said front face on each said pole piece having a depression therein substantially centered on and symmetrical about said longitudinal axis thereof;

each said depression extending across substantially more than one-half of said front face of each said pole piece and having a depression surface;

substantially the entire area of said depression surface being non-perpendicular to said longitudinal axis;

substantially the entire area of said depression surface being non-perpendicular to said longitudinal axis;

said front face of each said pole piece having a circumferential flat area thereon outwardly of and extending completely around said depression thereon; and, spacer means of non-ferromagnetic material interposed between said circumferential flat areas of said pole pieces and said auxiliary permanent means in said first and second magnet groupings for maintaining said pole pieces and said auxiliary permanent magnet means spaced-apart from one another against the magnetic attraction force therebetween, said test zone being inwardly of said spacer means.

2. The permanent magnet assembly of claim 1 including electromagnetic adjusting means independent of said first and second permanent magnet groupings for adjusting the magnetic field in said test zone for enhancing the strength and uniformity of said magnetic field in said test zone, said electromagnetic adjusting means being interposed between said first and second permanent magnet groupings outwardly of said test zone.

3. A test chamber assembly for subjecting a test object to a magnetic field of selected strength and relative uniformity, said test chamber comprising:

a housing made from a ferromagnetic material said housing defining a test chamber therewithin;

first and second magnet groupings disposed within said housing, each said magnet grouping including (a) a principal permanent magnet, (b) a ferromagnetic pole piece, said pole piece having opposite first and second faces and a peripherally extending edge, aid principal magnet contacting said pole piece at said second face thereof, and (c) auxiliary permanent magnet means, said auxiliary magnet means positioned at, contacting and extending completely about said peripherally extending edge of said pole piece;

said first magnet grouping disposed at a first end of said chamber and said second magnet grouping disposed at a second, opposite end of said chamber with the first faces of said first and second pole pieces being spaced from, facing and parallel to one another;

each said principal magnet and auxiliary magnet means arranged to make the polarity of said first face of said first magnet grouping pole piece opposite to that of said first face of said second magnet grouping pole piece, each said principal magnet and said auxiliary permanent magnet means contacting said housing whereby said housing, said principal magnets, said auxiliary permanent magnet means and said pole pieces create a path of magnetic energy flow for said magnetic field; and means disposed within said chamber to separate said first magnet grouping from said second magnet grouping, said first magnet grouping, said separation means, said second magnet grouping and said housing defining thereby a test zone across which said magnetic field created by said first and second magnet groupings extends;

said auxiliary permanent magnet means acting to enhance the strength and uniformity of said magnetic field between said pole pieces in said test zone; and means formed in said housing to enable the insertion of an object to be tested within said test zone and, thereby, said magnetic field.

4. The apparatus as recited in claim 3 wherein said insertion means is an aperture formed through said housing, said aperture positioned to enable the insertion of an object to be tested within said test zone.

5. The apparatus as recited in claim 3 wherein said insertion means comprises first and second apertures formed through said housing directly opposite one another.

6. The apparatus as recited in claim 3 wherein in each said magnet grouping said first and second faces of said pole piece are square; and said auxiliary magnet means comprises four bar magnets with each such magnet sized and shaped to be co-extensive with one edge of said pole piece adjacent said first face thereof.

7. The apparatus as recited in claim 3 wherein each said pole piece is cylindrical.

8. The apparatus as recited in claim 7 wherein each said magnet grouping said auxiliary magnet means includes a number of curved segments contacting said pole piece and extending about the entirety of said peripherally extending edge.

9. The apparatus as recited in claim 3, including adjusting means to adjust said magnetic field in said test zone to enhance the strength and uniformity of said magnetic field in said test zone.

10. The apparatus as recited in claim 9 wherein said adjusting means includes at least one electromagnet positioned within each said test zone and proximate said pole piece.

11. The apparatus as recited in claim 3 and including at least one secondary auxiliary permanent magnet positioned within said test zone proximate each said pole piece for enhancing the strength and uniformity of said magnetic field in said test zone.

12. Apparatus for creating and maintaining a magnetic field of selected strength and uniformity, said apparatus comprising:

a principal permanent magnet;

a ferromagnetic pole piece, said pole piece having opposite first and second faces and a peripherally extending edge, said principal magnet contacting said pole piece at said first face;

auxiliary permanent magnet means, said auxiliary magnet means positioned at, contacting, and extending substantially entirely about said peripherally extending edge of said pole piece for enhancing the strength and uniformity of the magnetic field at the peripherally extending end of the pole piece; and a first bevel formed on said peripherally extending edge of said pole piece, said first bevel sloping radially inwardly from said second face of said pole piece toward said first face of said pole piece; and a second bevel formed on said auxiliary magnet means, said second bevel formed complementarily to said first bevel, said pole piece edge and said auxiliary permanent magnet means contacting at said first and second bevels.

13. The apparatus as recited in claim 12 wherein said auxiliary magnet means and said pole piece have the same magnetic polarity where they meet at said first and second bevels.

14. Apparatus for creating and maintaining a magnetic field of selected strength and uniformity, said apparatus comprising:

a magnet housing;

first and second magnet groupings disposed within said housing, each such magnet grouping including:

(a) a principal permanent magnet;

(b) a ferromagnetic pole piece having opposite front and rear faces and an outer periphery, said principal magnet contacting said pole piece at said rear face, and (c) auxiliary permanent magnet means positioned at, contacting and extending about said periphery of said pole piece;

means disposed within said housing to separate said first and second magnet groupings;

said first and second magnet groupings being positioned in said housing with said front faces of said pole pieces facing one another in spaced-apart opposed relationship to provide an air gap across which a magnetic field extends between said first and second magnet groupings to define a test zone;

said auxiliary permanent magnet means acting to enhance the strength and uniformity of said magnetic field between said pole pieces in said test zone;

means formed in said housing to enable the insertion of an object to be tested within said test zone;

a hollow formed on said front faces of each said pole piece in each of said first and second magnet groupings for enhancing the strength and uniformity of said magnetic field in said test zone;

a bevel on said outer periphery of each said pole piece in each of said first and second magnet groupings, said bevel sloping radially inwardly from said front face of each said pole piece toward said rear face of each said pole piece;

said auxiliary permanent magnet means having a beveled surface contacting said bevel on said outer periphery of each said pole piece; and, said bevel and said beveled surface having complementary angles of inclination for further enhancing the strength and uniformity of said magnetic field in said test zone.

15. A test chamber for subjecting a test object to a magnetic field of selected strength and uniformity, said test chamber comprising:

a front panel, a rear panel, left and right side panels, a top panel, and a bottom panel, said panels assembled to define therebetween a right parallelepiped;

first and second magnet groupings disposed within said chamber, each said magnet grouping including (a) a principal permanent magnet, (b) a ferromagnetic pole piece having opposite front and rear faces and an outer periphery, said principal permanent magnet contacting said pole piece at said rear face thereof, and (c) auxiliary permanent magnet means positioned at and extending about said outer periphery of said pole piece;

means disposed within said chamber to separate said first and second magnet groupings;

said first and second magnet groupings being positioned in said housing with said front faces of said pole pieces facing one another in spaced-apart opposed relationship to provide an air gap across which a magnetic field extends between said first and second magnet groupings;

said auxiliary permanent magnet means acting to enhance the strength and uniformity of said magnetic field in said air gap;

means formed in one or more of said chamber panels to enable the insertion of an object to be tested within said magnetic field;

a hollow formed on said front face of each said pole piece in each of said first and second magnet groupings to provide said magnetic field with substantially uniform magnetic characteristics;

said outer periphery of each said pole piece in each of said first and second magnet groupings being formed with a bevel sloping radially inwardly from said front face of each said pole piece toward said rear face thereof;

said auxiliary permanent magnet means having a beveled surface contacting said bevel on said outer periphery of each said pole piece; and, said bevel and said beveled surface having complementary angles of inclination for further enhancing the strength and uniformity of said magnetic field in said air gap.

16. Apparatus for creating and maintaining a magnetic field of selected strength and uniformity comprising:

a principal permanent magnet;

said principal permanent magnet having opposite front and rear faces and an outer periphery;

auxiliary permanent magnet means positioned at, contacting, and extending about said outer periphery of said principal permanent magnet for enhancing the strength and uniformity of the magnetic field at the outer periphery of the principal permanent magnet;

said principal permanent magnet having opposite faces and including a hollow formed on one of said faces for enhancing the strength and uniformity of said magnetic field;

a bevel formed on said outer periphery of said principal permanent magnet and sloping radially inwardly from said one of said faces thereof toward the other of said faces;

said auxiliary permanent magnet means having a beveled surface contacting said bevel on said outer periphery of said principal permanent magnet; and, said bevel and said beveled surface having complementary angles of inclination for enhancing the strength and uniformity of said magnetic field.

17. A permanent magnet assembly for providing a magnetic field across an air gap comprising:

a ferromagnetic housing;

first and second permanent magnet groupings in said housing, each such grouping including;
  (a) a principal permanent magnet,
  (b) a ferromagnetic pole piece having opposite front and rear faces and an outer periphery, said principal permanent magnet contacting said rear face of said pole piece,
  (c) auxiliary permanent magnet means positioned at, contacting and extending about said outer periphery of said pole piece;

said principal permanent magnet and said auxiliary permanent magnet means in said first magnet grouping having north magnetic poles on the surfaces thereof engaging said pole piece in said first magnet grouping for providing a north magnetic pole on said front face of said pole piece in said first magnet grouping;

said principal permanent magnet and said auxiliary permanent magnet means in said second magnet grouping having south magnetic poles on the surfaces thereof engaging said pole piece in said second magnet grouping for providing a south magnetic pole on said front face of said pole piece in said second magnetic grouping;

said first and second magnet groupings being positioned in said housing with said north and south magnetic poles on said front faces of said pole pieces facing one another in spaced-apart relationship to provide an air gap across which a magnetic field extends to define a test zone;

said auxiliary permanent magnet means acting to enhance the strength and uniformity of said magnetic field between said pole pieces in said test zone;

said housing having means for allowing insertion of an object to be tested into said test zone;

said housing having an inner peripheral surface and said outer peripheral surface on each said pole piece being spaced inwardly of said housing inner peripheral surface; and said auxiliary permanent magnet means in each of said first and second magnet groupings completely spanning the space between said inner peripheral surface of said housing and said outer periphery of each said pole piece to provide a continuous solid flux path between each said pole piece and said housing that is uninterrupted by any air gap.

18. The permanent magnet assembly of claim 17 including electromagnetic adjusting means independent of said first and second permanent magnet groupings for adjusting the magnetic field in said test zone for enhancing the strength and uniformity of said magnetic field, said electromagnetic adjusting means being interposed between said first and second permanent magnet groupings outwardly of said test zone.

19. The permanent magnet assembly of claim 17 including spacer means of non-ferromagnetic material interposed between said pole pieces and said auxiliary permanent magnet means of said first and second magnet groupings for maintaining said pole pieces and said auxiliary permanent magnet means spaced-apart from one another against the magnetic attraction force therebetween, said test zone being inwardly of said spacer means.

20. The permanent magnet of claim 17 wherein each said pole piece in each of said first and second magnet groupings has a longitudinal axis;

each said front face on each said pole piece having a depression therein substantially centered on and symmetrical about said longitudinal axis thereof;

each said depression extending across substantially more than one-half of said front face of each said pole piece and having a depression surface;

substantially the entire area of said depression surface being non-perpendicular to said longitudinal axis; and said front face of each said pole piece having a circumferential flat thereon outwardly of and extending completely around said depression thereon.

21. The permanent magnet assembly of claim 17 wherein said principal permanent magnet and said pole piece rear face in each of said first and second magnet groupings defines a contact area having a contact area outer periphery and each said principal permanent magnet and each said pole piece have substantially the same size and shape at said contact area, said auxiliary permanent magnet means in each of said first and second magnet groupings extending radially outwardly from each said contact area outer periphery a substantial distance beyond each said contact area outer periphery for substantially enhancing the strength and uniformity of said magnetic field between said pole pieces in said test zone.

22. A permanent magnet assembly for providing a magnetic field across an air gap comprising:

a ferromagnetic housing;

first and second permanent magnet groupings in said housing, each such grouping including:
  (a) a principal permanent magnet,
  (b) a ferromagnetic pole piece having opposite front and rear faces and an outer periphery, said principal permanent magnet contacting said rear face of said pole piece,
  (c) auxiliary permanent magnet means positioned at, contacting and extending coextensively about said outer periphery of said pole piece;

said principal permanent magnet and said auxiliary permanent magnet means in said first magnet grouping having north magnetic poles on the surfaces thereof engaging said pole piece in said first magnet grouping for providing a north magnetic pole on said front face of said pole piece in said first magnet grouping;

said principal permanent magnet and said auxiliary permanent magnet means in said second magnet grouping having south magnetic poles on the surfaces thereof engaging said pole piece in said second magnet grouping for providing a south magnetic pole on said front face of said pole piece in said second magnet grouping;

said first and second magnet groupings being positioned in said housing with said north and south magnetic poles on said front faces of said pole pieces facing one another in spaced-apart relationship to provide an air gap across which a magnetic field extends to define a test zone;

said auxiliary permanent magnet means acting to enhance the strength and uniformity of said magnetic field in said test zone;

said housing having means for allowing insertion of an object to be tested into said test zone;

said principal permanent magnet and said pole piece rear face in each of said first and second magnet groupings defines a contact area having a contact area outer periphery and each said principal permanent magnet and each said pole piece have substantially the same size and shape at said contact area, said auxiliary permanent magnet means in each of said first and second magnet groupings extending radially outwardly from each said contact area outer periphery a substantial distance beyond each said contact area outer periphery for substantially enhancing the strength and uniformity of said magnetic field in said test zone; and means for providing a continuous solid flux path between said outer periphery of each said pole piece and said housing that is uninterrupted by any air gap, said means for providing including at least part of said auxiliary permanent magnet means.

23. The permanent magnet assembly of claim 22 including electromagnetic adjusting means independent of said first and second permanent magnet groupings for adjusting the magnetic field in said test zone to enhance the strength and uniformity of said magnetic field in said test zone, said electromagnetic adjusting means being interposed between said first and second permanent magnet groupings outwardly of said test zone.

24. The permanent magnet assembly of claim 23 including spacer means of non-ferromagnetic material interposed between said pole pieces and said auxiliary permanent magnet means of said first and second magnet groupings for maintaining said pole pieces and said auxiliary permanent magnet means spaced-apart from one another against the magnetic attraction force therebetween, said test zone being inwardly of said spacer means.

* * * * *